(12) United States Patent
Frey

(10) Patent No.: US 7,548,123 B2
(45) Date of Patent: Jun. 16, 2009

(54) DIVIDERLESS PLL ARCHITECTURE

(75) Inventor: Douglas R. Frey, Bethlehem, PA (US)

(73) Assignee: Silicon Laboratories Inc., Austin, TX (US)

(*) Notice: Subject to any disclaimer, the term of this patent is extended or adjusted under 35 U.S.C. 154(b) by 51 days.

(21) Appl. No.: 11/777,779

(22) Filed: Jul. 13, 2007

(65) Prior Publication Data
US 2009/0015338 A1    Jan. 15, 2009

(51) Int. Cl.
H03L 7/16    (2006.01)
H03L 7/18    (2006.01)

(52) U.S. Cl. .................. 331/16; 331/1 A; 331/17; 331/25

(58) Field of Classification Search .......... 331/1 A, 331/16–18, 25; 327/156–159
See application file for complete search history.

(56) References Cited

U.S. PATENT DOCUMENTS 7,068,110 B2    6/2006    Frey et al.
7,345,549 B2 *  3/2008    Xu .................. 331/1 A
2004/0232995 A1  11/2004    Thomsen et al.

* cited by examiner

Primary Examiner—David Mis
(74) Attorney, Agent, or Firm—Zagorin O'Brien Graham LLP

(57) ABSTRACT

A phase-locked loop (PLL) achieves initial lock using a course fractional-N divider driving a binary phase detector. Once frequency lock is achieved, this divider may be turned off, while an adaptive phase detector takes over control of the PLL front end. The adaptive phase detector (APD) receives input directly from the VCO and the reference clock, deriving digital control signals and a precision phase detector output. The APD operates at the update rate, generating a digital delta sigma modulator (DSM) data stream output at the update rate. The APD automatically locks to a digitally generated ramp corresponding to an expected difference between the VCO output and the reference clock, while adaptively correcting for DC errors and ramp cancellation errors.

38 Claims, 12 Drawing Sheets

DIVIDERLESS PLL ARCHITECTURE

CROSS-REFERENCE TO RELATED APPLICATION(S)

BACKGROUND

1. Field of the Invention

This invention relates to phase-locked loops (PLLs) and more particularly to PLL architectures that can provide high performance with low power utilization.

2. Description of the Related Art

Phase-locked loops (PLLs) are common in modern electronic systems. A high-level block diagram of a typical prior art PLL 100 is shown in FIG. 1. A phase/frequency detector (PFD) 103 compares a feedback divided signal 104 from feedback divider 105 and a reference clock signal 107. The difference is used to control the voltage controlled oscillator (VCO) 108. The PLL typically multiplies the reference clock signal using the feedback divider circuit 105. The divide value of the feedback divider 105 determines the amount of multiplication. Some PLL architectures are fractional-N PLLs where the PLL output 109 is a non-integral multiple of the reference clock 107. One aspect of PLLs is that the feedback divider tends to consume significant power because it is high speed and complex, particularly in fractional-N architectures.

As power is an important factor in many electronic designs, it would be desirable to achieve power savings in PLLs.

SUMMARY

Accordingly, a new PLL architecture is provided for implementing fractional-N (and integer) PLLs that can provide high performance, low power, and be implemented with low complexity. In an embodiment, the PLL achieves initial lock using a course fractional-N (or integer) divider driving a binary phase detector. Once frequency lock is achieved, this divider may be turned off, while the adaptive phase detector takes over control of the system front end. The fractional-N (or integer) divide circuitry may be maintained in the background as a "watchdog" to monitor frequency lock if desired. The adaptive phase detector (APD) receives input directly from the VCO and the reference clock, deriving digital control signals and a precision phase detector output. The APD operates at the update rate (the reference clock frequency), generating a digital delta sigma modulator (DSM) data stream output at the update rate. The APD automatically locks to a digitally generated ramp, while adaptively correcting for DC errors and ramp cancellation errors.

In one embodiment, a method is provided that includes generating a phase-locked loop (PLL) output signal without using a feedback divider that is a frequency multiple, greater than 1, of a reference clock signal supplied to the PLL. In an embodiment the feedback divider is a fractional-N divider and the PLL output signal is a non-integer multiple of the reference clock signal. In another embodiment the feedback divider is an integer divider and the PLL output signal is an integer multiple of the reference clock signal.

In an embodiment the method further includes operating the PLL in a first mode in which an output of the feedback divider is compared with the reference clock signal to lock the PLL output signal to the reference clock signal; and operating the PLL in a second mode after lock is achieved in the first mode to generate the PLL output signal without the feedback divider while remaining locked to the reference signal.

In an embodiment the feedback divider is periodically brought back into the PLL loop to evaluate lock of the PLL.

In an embodiment, the method includes generating a phase error signal during the second mode in a first phase detector in the PLL according to a length of time between an edge of the reference clock signal and an edge of a controllable oscillator output signal after the edge of the reference clock signal.

In another embodiment a phase-locked loop (PLL) is provided that includes a controllable oscillator (such as a voltage controlled oscillator). The phase-locked loop is operable to compare an output signal of the controllable oscillator to a reference clock signal supplied to the phase-locked loop in a phase detector, adjust the controllable oscillator according to the comparison, and supply as an output of the phase-locked loop a frequency multiple greater than one of the reference clock signal. The output of the PLL may be an integer or non-integer multiple greater than one of the reference clock signal.

In another embodiment a phase-locked loop (PLL) is provided that is operable in a first mode, to lock to a reference clock signal using a feedback divider in the PLL and operable in a second mode with the feedback divider disconnected from the PLL, to generate a PLL output signal that is a frequency multiple, greater than one, of the reference clock signal.

In an embodiment the PLL includes a controllable oscillator and a first phase detector coupled to receive an output of the controllable oscillator and the reference clock signal and is configured to generate, in the second mode, a phase error signal according to a length of time between a transition of the reference clock signal and a particular transition of the output signal of the controllable oscillator with respect to the transition of the reference clock signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
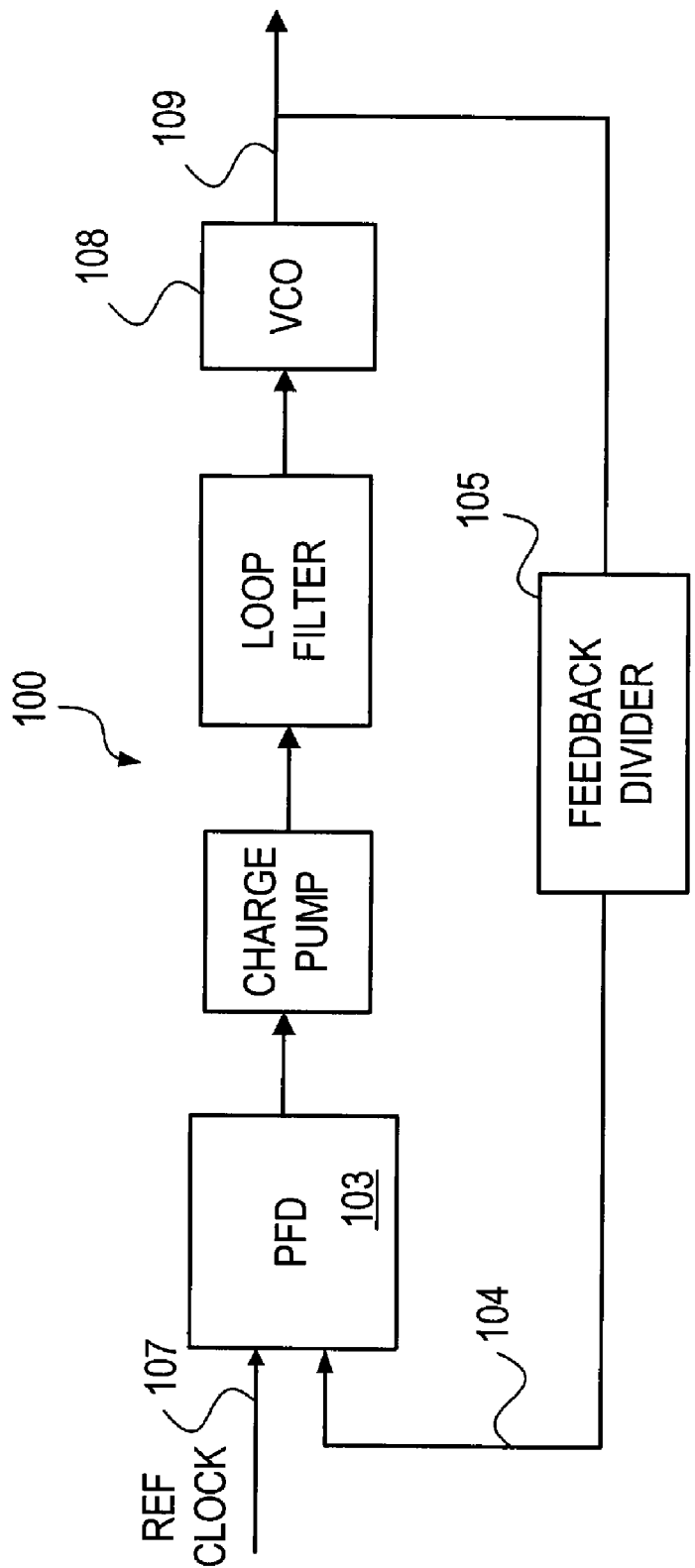
FIG. 1 illustrates a prior art PLL.
Figure 2:
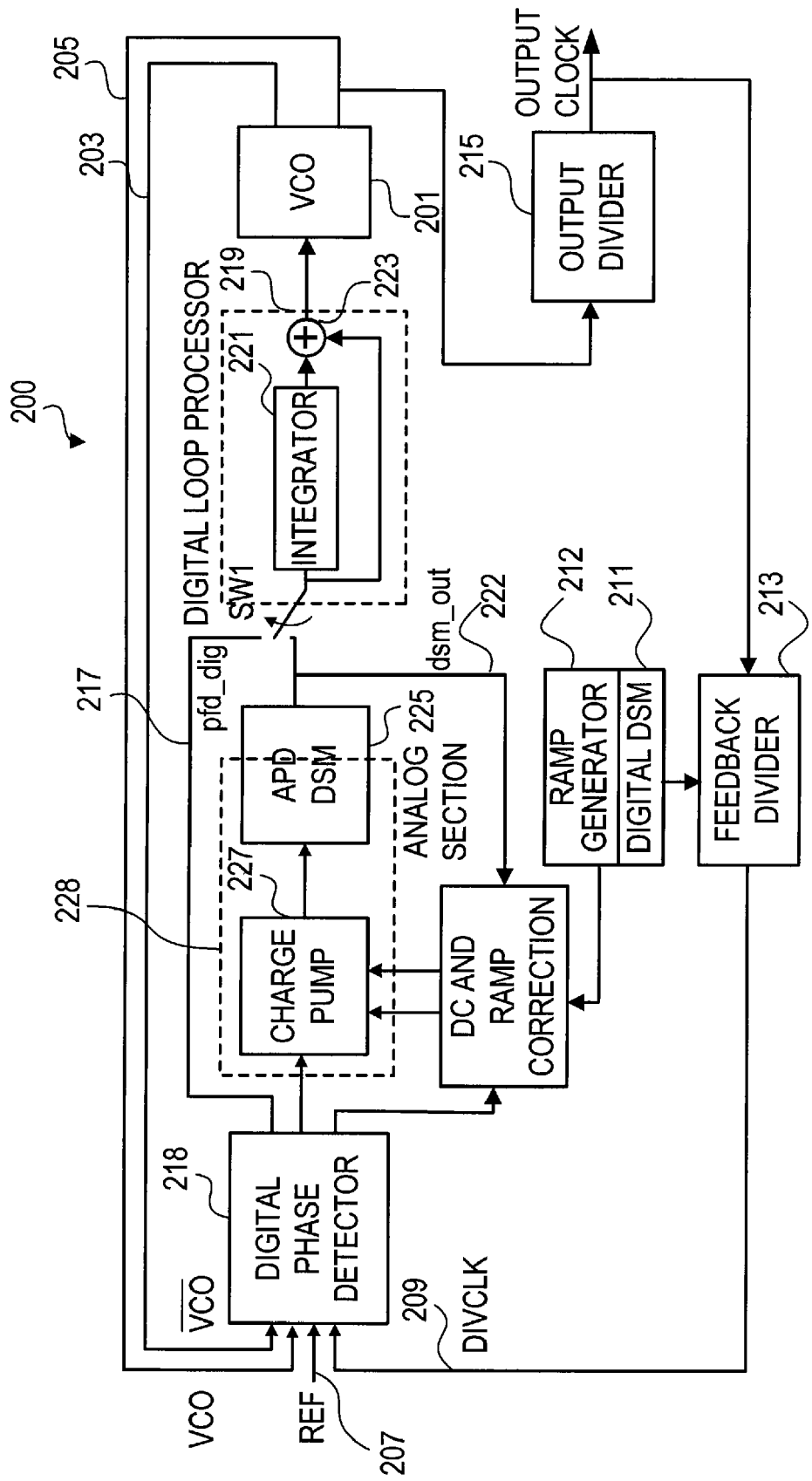
FIG. 2 illustrates a block diagram of a PLL according to an embodiment of the invention.

Referring to FIG. 2, illustrated is an exemplary PLL 200 according to an embodiment of the invention. The VCO 201 is assumed to yield both phases 203 and 205 of the VCO clock. These are sent to the front end for processing with the reference clock (REF clock) 207 and the output (DIVCLK) 209 of the feedback divider 213. There are two main modes of operation of PLL 200. The first is purely digital, while the PLL 200 locks to the REF clock 207. In this mode the digital delta sigma modulator (DSM) 211 generates a control signal to the Feedback Divider 213 that provides the DIVCLK 209 signal corresponding to the standard fractional-N approach, although operating on a coarse clock, i.e., lower frequency than the VCO, from the output of the Output Divider 215. A binary phase detector output (pfd_dig) 217 from the digital phase detector 218, provides a signal which drives the digital loop processor 219, which provides a loop filter function, comprising an integrator 221 and summer 223 preceding the VCO 201, as long as control signal, SW1, is asserted. This operation continues until lock is achieved, albeit with significant phase jitter. At that time, the switch control signal SW1 is reset and the digital loop processor 219 is supplied with the digital output (dsm_out) 222, from the adaptive phase detector (APD) DSM block 225. From this time on, the feedback divider 213 and the digital DSM 211 can have their power reduced by being disabled or turned off, thus saving power. However, it may be desirable to keep them active in a low power mode as a watchdog to ensure system frequency lock. For example, the feedback divider 213 and the digital DSM 211 may be periodically taken out of low power mode (e.g., turned back on) to provide an extra check that the system is still frequency locked to the reference signal.

When the control signal SW1 is reset, the second main mode of operation begins. In this mode, the Digital Phase Detector sends a signal to the charge pump 227 so that it produces current for an interval extending from the positive edge of the REF clock 207 to the first positive edge of the VCO clock 205 following this. In practice a short delay may be added to improve system performance as discussed later. Added to this charge pump current (as explained in additional detail below) are other currents that ensure zero DC offset and zero ramp signal appearing at the output of the DSM block 225, which provides an analog to digital conversion of the combined currents. In order to understand various issues associated with this architecture, observe that under normal operation, the VCO clock edges will be sliding past the REF clock edges on successive update times due to these clocks having frequencies that are not integer multiples. Because the output from the digital phase detector 218 is always controlled by the first positive edge of the VCO following the REF clock plus a possible delay, that edge will occur somewhere in a 1 VCO unit interval window after the REF clock edge. The average time will be ½ of a VCO unit interval plus any intentional delay. This will cause an average current to be developed from the charge pump that will have to be offset for a zero average output from the DSM block 225. However, since this average current is well specified, it is possible to cancel it without excessive circuitry or processing as described below. More significant is the fact that there will be a strong ramp signal introduced by the charge pump corresponding to the sliding of the REF and VCO clock edges relative to one another. Fortunately, this ramp waveform is exactly known in the digital DSM circuitry 211, being produced by the ramp generator 212, which is typically an integral part of the DSM 211.

The ramp generator may be implemented as a digital accumulator similar to a modulo counter. The integer portion is used to generate the ramp and the fractional portion is accumulated. When the digital accumulator reaches the appropriate predetermined value corresponding to the end of the ramp, the integer portion resets. The fractional portion remains. At some point the fractional portion carries over to the integer portion. Sufficient accuracy can be achieved in the ramp function with, e.g., 8 bits in the fractional portion. The signal from this ramp generator 212 is converted to analog and subtracted from the charge pump signal, in principle eliminating the systematic ramp signal. Naturally, in practice such cancellation is impossible to achieve with sufficient accuracy using uncalibrated feed forward electronics. In an embodiment, the output of the APD DSM block 225 is correlated with the ramp to create an adaptive control signal that automatically fine tunes the ramp cancellation. As a result, it is possible to cancel the DC average and the ramp signal with a high degree of precision. Thus, in normal operation, the output signal from the APD DSM block 225 only contains the jitter due to the input and output circuitry of the PLL.

In order to adequately represent the jitter information so that low jitter operation can be achieved, one approach is to significantly oversample the charge pump output in the APD DSM block 225. The oversampling clock, however, can only be derived from the VCO, which adds additional divider circuitry to the PLL, consuming power and creating more potential spurs. Furthermore, such oversampling would necessitate high speed DSP circuitry which can add to the power of the PLL.

Another approach is to use a DSM block operating at the REF clock rate, which can be accomplished with an adaptive approach to processing during this phase of the PLL operation.

Given that the output of the APD DSM block 225 is a good representation of the jitter at the input of the system, this signal may be sent to the digital loop processor 219 where it is integrated and added to itself to produce the composite digital signal driving the VCO 201. The interface to the VCO can be a DAC expander circuit, one embodiment of which is described in e.g., U.S. Pat. No. 6,825,785, issued Nov. 30, 2004, entitled "Digital Expander Apparatus and Method for Generating Multiple Analog Control Signals Particularly Useful for Controlling a Sub-varactor Array of a Voltage Controlled Oscillator", naming Yunteng Huang et al. as inventors, which is incorporated herein by reference. Of course other suitable interfaces to the DAC may also be used. Note that the architecture described herein utilizes almost all digital processing except for the portion 228 indicated by the dotted line that includes charge pump 227 and the first part of the APD DSM block 225 (described below). All digital signal processing is done at the REF clock frequency (with the possible exception of the DAC expander circuitry) reducing power and timing constraints. The analog front end circuitry is unipolar, since it only operates with positive outputs resulting from the fact that it selects VCO edges only trailing the REF clock edges. This simplifies the charge pump and eliminates the zero crossing issues of the phase detector regarding linearity.

The discussion below describes the correct operation of the PLL with this control scheme having two modes of operation and the cancellation of errors at the front end, particularly those related to the ramp signal in the second mode.

The first major task for the architecture described herein is for the system to achieve initial frequency and phase lock in the first operational mode. Given that the digital DSM 211 produces a reasonable output sequence, the PLL will lock with the reliability of any standard fractional-N PLL system; however, the equilibrium jitter will be large due to the coarse unit interval of the Feedback Divider clock output, which is assumed for discussion here to be approximately 8 (typically 3-15) times slower than the VCO clock. Of course, other relationships between the feedback divider clock output and the VCO clock are possible. Note that if lower frequency output clocks are desired, further division of the output divider 215 clock output is possible without affecting the operation of the circuitry described herein. Simulation has shown that lock can be achieved for +/−1% frequency error. Lock detection is easily accomplished by low pass filtering of the pfd_dig signal 217. A point of interest in understanding the phase locking during the first mode is that one wishes to lock to the time instant corresponding to the average time of the VCO positive clock edge following the REF clock plus any intentional delay. This minimizes the transient behavior at the transition from mode one to mode two.

Having achieved frequency and phase lock in the first mode of operation, the Feedback Divider 213 is no longer needed. The Digital DSM 211 may also be disabled, further reducing power consumption. Given low jitter steady state operation, one may simply assume that the right number of VCO clock edges will occur between REF clock edges. Hence, the circuitry only needs to adjust to small scale jitter, significantly less than a VCO unit interval. However, due to the phase of the VCO and the REF clocks sliding with respect to one another, there will be a systematic 1 VCO UI peak to peak ramp observed as the time between a REF clock rising edge and the next VCO rising edge. This is because of the fact that the next VCO clock edge must occur sometime between 0 and 1 VCO UI after the REF clock edge. Given that the edges are sliding with respect to one another, then the time between the REF clock edge and the following VCO clock edge must ramp between 0 and 1 VCO UI. Observe that the average time between the edges will therefore be ½ of the VCO UI.

Figure 3A:
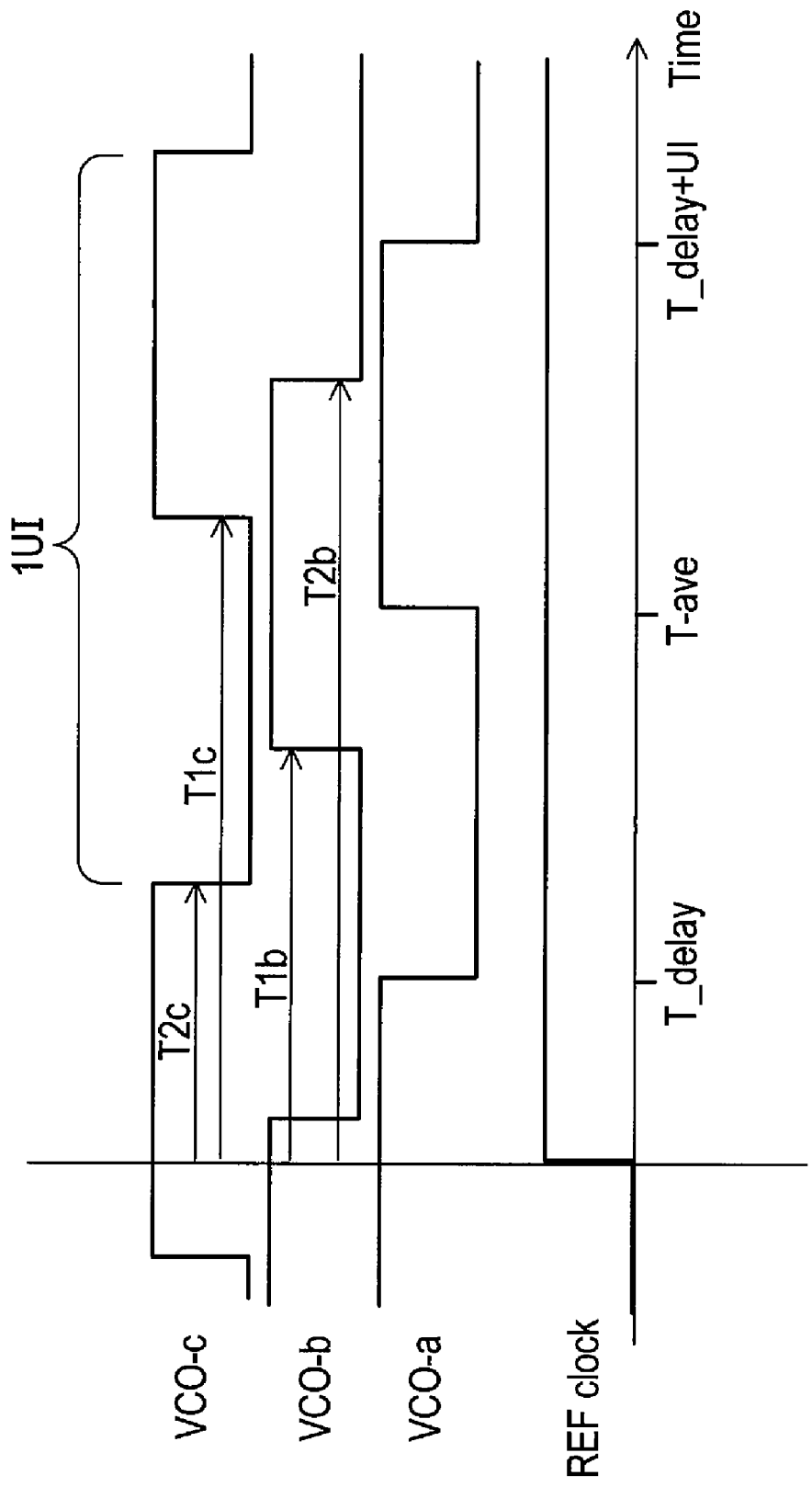
FIG. 3A is a timing diagram illustrating how the phases of the reference clock and the VCO clock slide in relation to each other.

Referring to FIG. 3A, the REF clock edge defines t=0. Note that T_delay may be intentionally introduced in order to improve the analog performance of the front end circuitry. Following this, the next VCO edge beyond T_delay defines a time T1b, shown for the VCO-b instance, whose value is on average T_ave=½UI+T_delay, where UI denotes the VCO clock unit interval. Over a number of REF clock intervals, the value of T1b sweeps between T_delay and T_delay+UI, due to the sliding of the VCO phase relative to the REF clock phase given a non-integer frequency ratio. FIG. 3A shows three instances, a, b, and c. Notice that a second time, T2b, is defined by the interval between the rising edge of REF clock and the next falling edge of the VCO clock beyond T_delay for the VCO-b instance.

Using these ideas and definitions, the operation of the front end can be appreciated. First, consider the initial mode of operation. During this mode, the feedback divider 213 is enabled, producing edges that are compared to a reference phase to achieve initial frequency and phase lock. As suggested earlier, in order to minimize transient behavior, it is beneficial to lock to the phase instant corresponding to T_ave. Due to the coarse binary nature of the phase detection in this mode, it is possible to compare the DIVCLK edge from the Feedback Divider to the first negative edge following the REF clock, plus T_delay, to easily achieve the desired lock point.

To see this, observe that the DIVCLK edge will line up with one of the positive VCO clock edges, assuming the usual retiming circuitry is a part of the Feedback Divider. The waveform VCO-a in FIG. 3A shows an example of a VCO waveform that would be observed at the binary threshold, where the rising edge of the VCO clock, corresponding to the DIVCLK edge, occurs at T_ave. Now suppose that the DIVCLK edge occurs at a time following T_ave. Using FIG. 3A, that case might correspond to the VCO-b instance, for example. In this case the DIVCLK must occur later than T2b, as does the next positive edge of the VCO clock. On the other hand, suppose that the DIVCLK edge occurs before T_ave. Clearly, this edge must occur before T2b (note the VCO-b instance of FIG. 3A). The VCO-b instance covers all cases where T1 is less than T_ave and T2 is greater than T_ave. The other scenario is depicted by instance c, where T2 is less than T_ave and T1 is greater than T_ave. Again assuming that DIVCLK occurs after T_ave, it follows that DIVCLK occurs after T2c. If DIVCLK occurs before T_ave, it must occur before T2c. Thus, by comparing DIVCLK to T2, one obtains an unambiguous determination of whether DIVCLK occurs before or after T_ave. Furthermore, there is roughly ½ UI (of the VCO) of slack delay that can occur in the generation of DIVCLK without affecting the result. Therefore, one can develop pfd_dig through a simple standard phase detector front end, such as that shown in FIG. 3B.

Figure 3B:
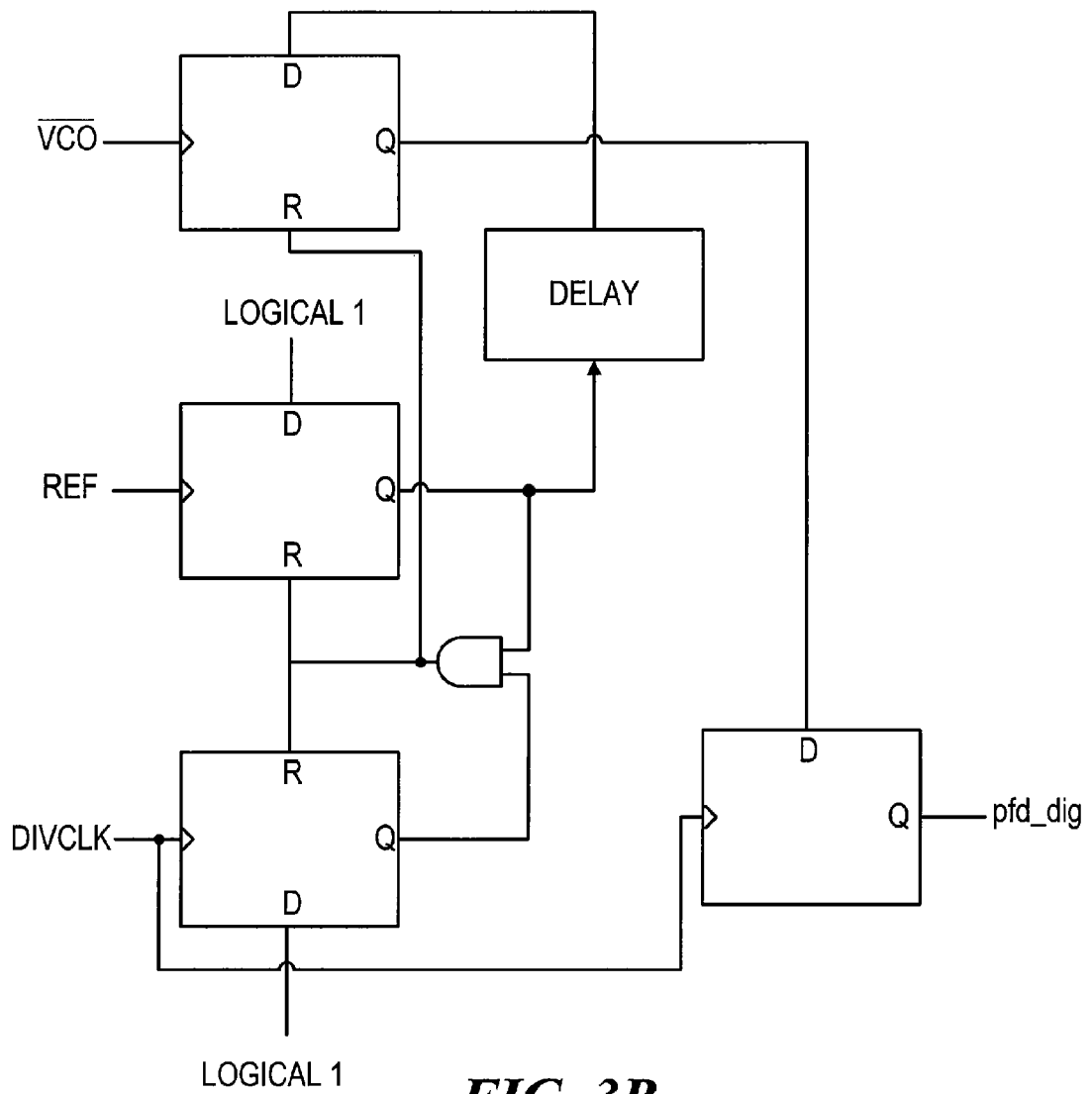
FIG. 3B illustrates a phase detector that may be used to generate pfd_dig.
Figure 3C:
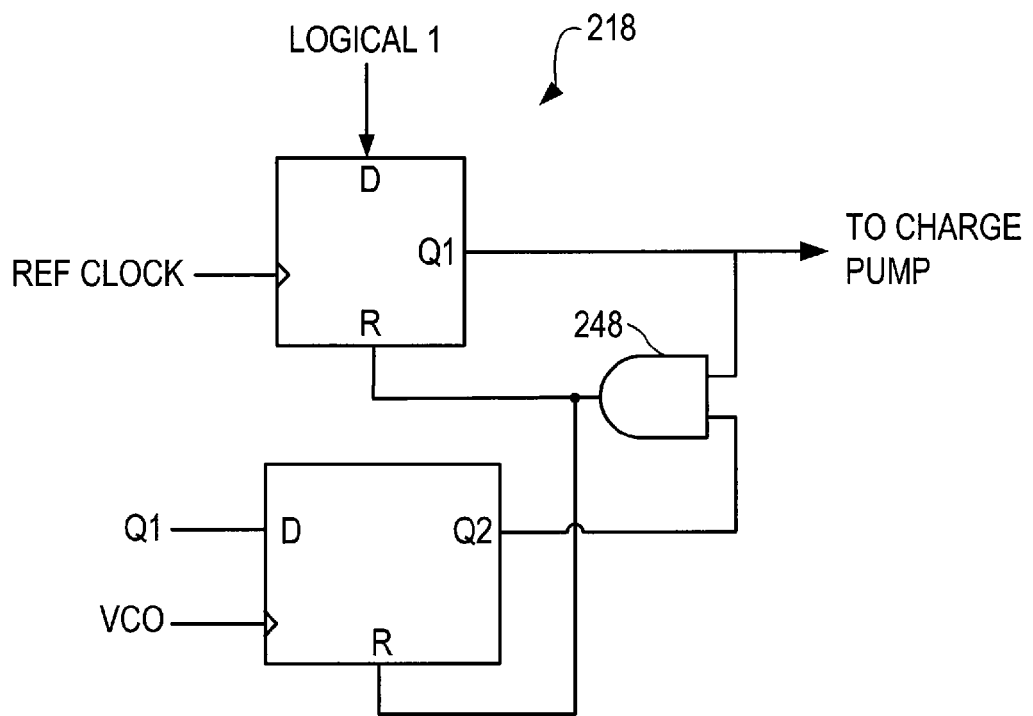
FIG. 3C illustrates a phase detector that may be used to detect the VCO clock in relation to the reference clock.

During the second mode of operation, clock signals T1 and T2 are both used, although T1 is the only signal that needs to carry precision phase information. The charge pump 227 activates a current source at the instant when REF clock occurs. This current is terminated when T1 occurs, following the operation of a standard phase detector and charge pump. FIG. 3C illustrates an exemplary portion of phase detector 218 that may be utilized to detect the VCO edge relative to an edge of the reference clock. The net charge produced is ideally T1 times the current source, $I_{CP}$ (charge pump current), value; however, switching time issues with the transistor circuitry will add an offset to this value. Clearly, this charge will have an average value of approximately T_ave times $I_{CP}$. It will further comprise a sawtooth (ramp with reset), whose peak to peak amplitude will be UI times $I_{CP}$. In order for the front end to be useful, both the DC and the ramp component must be eliminated so that the gain of the front end can be made large enough to enable low jitter PLL operation without overloading the front end. Note that the phase detectors shown in FIGS. 3B and 3C are both part of digital phase detector block 218. A substantial amount of commonality in the functions shown in FIG. 3B and FIG. 3C in phase detector block 218 may allow for efficient implementation of the two different phase detector functions.

Fortunately, both the DC and the ramp component may be estimated to be within approximately 10% by reasonable matching of current sources and estimates of clock windows. For example, since the charge pump current, $I_{CP}$ and T_ave are known, a compensating DC offset current can be introduced with reasonable accuracy. Furthermore, since the VCO UI and charge pump current are known, an offsetting ramp current waveform can also be introduced with reasonable accuracy. However, in the case of ramp cancellation, not only must the amplitude be very carefully matched, but the reset time must also be matched.

Figure 5:
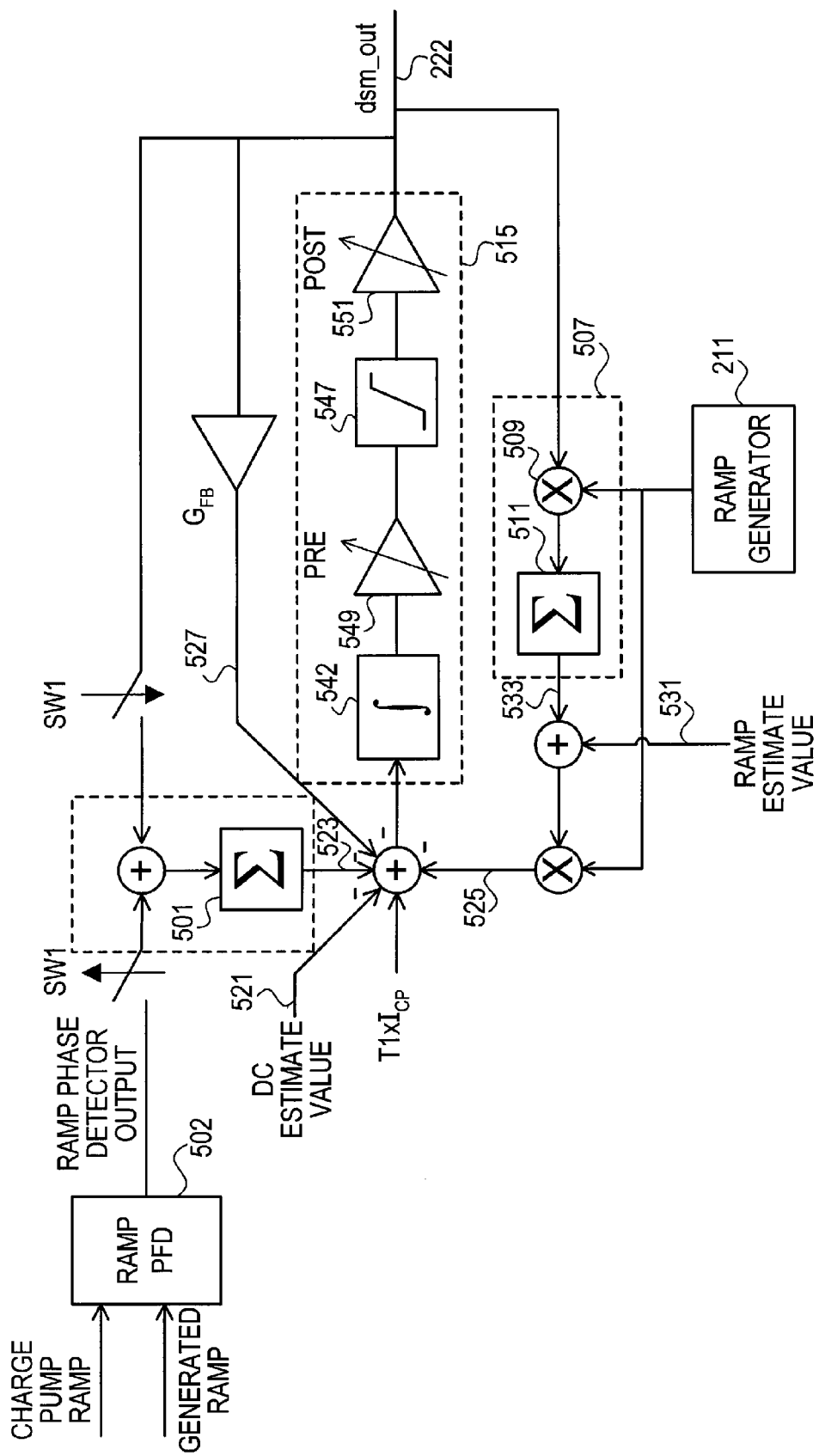
FIG. 5 illustrates a block diagram showing additional details of the front end of the PLL of FIG. 2.

Consider the DC cancellation, since this is adapted first. Suppose that a good estimate of the cancellation current is subtracted from the charge pump input current. The remaining average current component can be found by looking at the output of the APD DSM 225, integrating this signal, and feeding it back as additional DC offset to the input. This approach works well as long as the phases of the VCO and REF clocks slide fairly quickly with respect to one another, which is the case while the VCO frequency wanders during mode one to obtain frequency lock. Note that a short period of wander can be intentionally added to give this circuitry time to adjust. Since the output of the APD DSM 225 is digital, the feedback integrator 501 shown in FIG. 5 is digital and the equilibrium integrator output remains constant for as long as is necessary. Also note that during the first mode of operation the APD DSM 225 is not a part of the active PLL. Hence, this interval of time allows unfettered adjustment of DC offsets. When mode two operation begins, the feedback integrator 501 holds the DC offset and it is no longer updated by the output of the APD DSM. Any error that develops after the transition to mode two is adjusted as explained in the next section.

Figure 4:
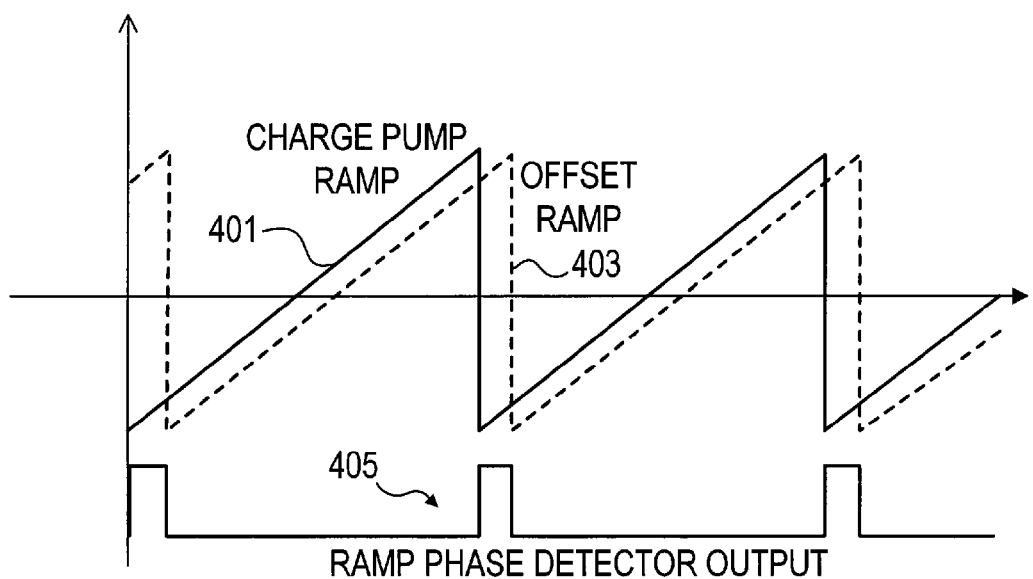
FIG. 4 is a timing diagram that illustrates the charge pump ramp and the offset ramp waveforms.

To understand the next part of the operation, it is necessary to consider the ramp cancellation, which affects the amount of the sawtooth waveform that appears at the output of the APD DSM. FIG. 4 helps in the visualization of the signals. Assume that the ramp component of charge coming from the charge pump is offset by an internally generated ramp waveform whose amplitude, for the time being, is exactly correct; however, its reset time (time of jump) is not synchronized to that of the charge pump signal. FIG. 4 illustrates the charge pump ramp waveform 401 and the offset ramp waveform 403 as they might occur. Two important aspects of this scenario need to be observed. First, the average value of each of the ramp signals is the same. Therefore, given that these waveforms are subtracted, a variation in the slip between them has no effect on the DC average after subtraction. Secondly, the ramp waveform from the charge pump can only be cancelled if the slip between the waveforms is zero. These two aspects are important to the behavior of the PLL front end.

To be specific, suppose that the system (PLL) were in lock and that there were no slip between the waveforms. Now suppose that a DC error appears in the APD DSM 225, due to drift for example. In a standard PLL front end this DC error would be fed to the loop filter where it would be ultimately applied to the VCO, causing a phase shift in the VCO clock that tended to produce a competing DC shift to cancel the error. Considering the proposed system, the VCO phase shift would cause a slip between the ramp signals, which would not result in a DC shift after cancellation. Naturally, this precludes proper operation of the loop.

A solution for this problem solves both the DC issue and the problem of maintaining zero slip between the waveforms. It amounts to another phase detector. Specifically, suppose that the jump in the respective ramp waveforms triggers a standard phase and frequency detector (PFD), treating the internally generated ramp as the reference and the charge pump output as the feedback clock. Such an architecture would generate "up" and "down" signals in the usual way that can be used to drive the loop into lock. From these signals this second phase detector generates a pulse 405, called the "ramp phase detector output" in FIG. 4, whose duration is proportional to the time between edges on the respective ramp signals.

Furthermore, the pulse will have a polarity which drives the system to advance or delay the VCO clock, driving the loop into lock. Note that the duration of the pulse will be an integer number of unit intervals of the REF clock. In fact, the signal is a simple digital signal that may be added to the digital data signal in the loop. While a natural point to add this signal would be following the APD DSM 225 and before the loop filter, it is advantageous to add this signal before the APD DSM 225 so that DC errors appearing within that block are corrected as part of the process. This guarantees that the output of the APD DSM 225 will be simultaneously driven to zero as the two ramp signals are locked. Referring to FIG. 5, the output of the ramp phase detector 502 is used when the control signal SW1 is reset, to adjust the DC correction integrator 501. If this mode of operation begins only after the first mode of PLL operation, then DC offset is approximately correct and only small adjustment is typically necessary to correct DC errors in the APD DSM. Drift in the analog circuitry will also be corrected with this approach.

Unlike the operation of a typical phase detector, however, the correction just described requires attention to another detail for proper operation. In the typical case the slip between a reference and a feedback clock is corrected by a fixed polarity pulse determined by the phase detector. In the present case, the slip between the ramp signals is equivalent to the beat frequency between the desired PLL frequency and the instantaneous PLL frequency. Consequently, identical slippage can result from a given positive frequency error in one instance as from the same negative frequency error in another case. In these two cases, however, the loop must be driven in opposite ways to reach lock. Fortunately, this ambiguity can be anticipated accurately by knowledge of the NDIV value which drives the Digital DSM and the ramp generator. Specifically, using the divide value for the PLL, NDIV, one may easily derive a fixed (for a given frequency of operation) plus/minus control bit to ensure that the loop is driven to lock by adding/subtracting the pulse appropriately in the DC correction integrator.

Figure 6A:
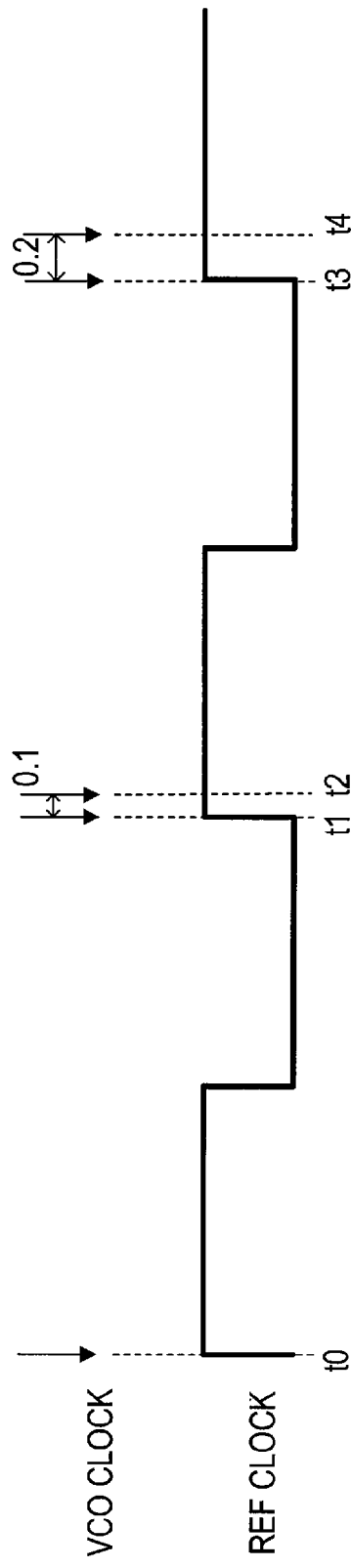
FIG. 6A is a timing diagram illustrating the relationship between the reference clock and the VCO clock.
Figure 6B:
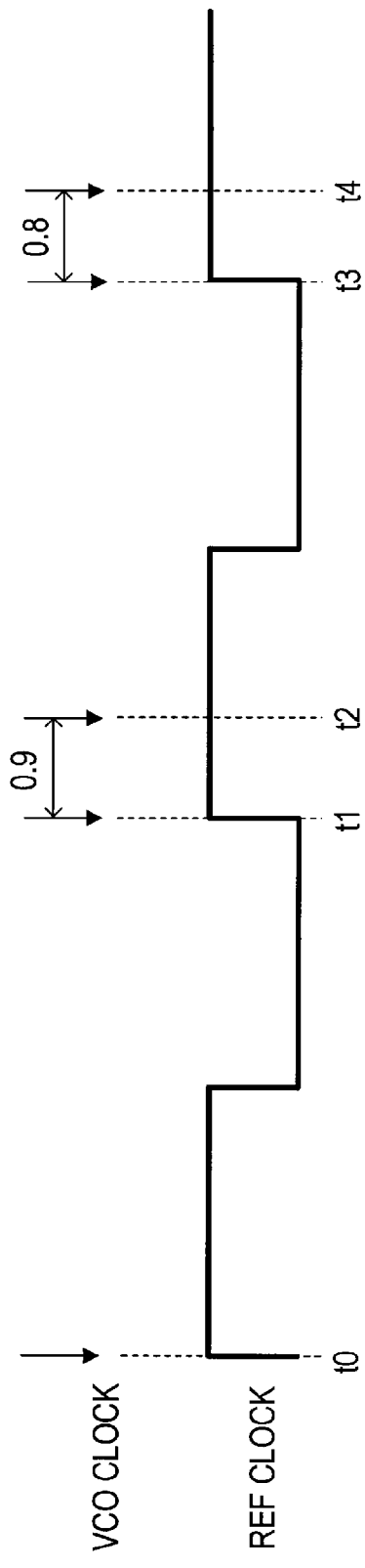
FIG. 6B is a timing diagram illustrating the relationship between the reference clock and the VCO clock.

This can be understood by way of the examples shown in FIGS. 6A and 6B. FIG. 6A assumes a 10 MHz reference clock and a divide value (NDIV) of 99.9. That means that the VCO output clock is 999 MHz. Assume further with respect to FIG. 6A that the reference clock lines up exactly with the VCO clock at time t0. In terms of VCO clocks, 99.9 VCO clock cycles occur between successive rising edges of the REF clock, occurring at t0 and t1. Thus, the first rising edge of the VCO clock seen after t1 is at t2, which is 0.1 UI after t1. After the next reference clock edge at time t3, the next VCO edge occurs 0.2 UI after the reference clock edge at t4. This pattern represents a beat frequency between the closest integer (100) and the VCO clock that ramps in up 0.1 increments. Note that the time scales are exaggerated for clarity in FIGS. 6A and 6B.

FIG. 6B assumes a 10 MHz reference clock and a divider value of 100.1. That means that the VCO output clock is 1.001 GHz. Assume again with respect to FIG. 6B that the reference clock lines up exactly with the VCO clock at time t0. Between t0 and t1, 100.1 reference clocks occur. Thus, the first rising VCO edge seen after t1 is at t2, which is 0.9 UI after t1. With respect to the next reference clock rising edge at t3, the next rising VCO clock edge at t4 occurs at 0.8 UI after t2. This pattern represents a beat frequency between the closest integer (100) and the VCO clock that ramps down in 0.1 increments. Thus, the same slippage, e.g., 0.1 UI, can represent the circumstances in FIGS. 6A or 6B. A further appreciation of the difference in these scenarios comes from observing that the ramps shown in FIG. 4 are indicative of the FIG. 6A case, where the slippage increases until it jumps back down. The FIG. 6B case leads to ramps which ramp down until they jump back up. If the ramp phase detector produces an output pulse corresponding to the relative timing of the jumps, then the same ramp time offset in the FIG. 6A case or the FIG. 6B case will produce the same ramp phase detector output pulse. However, in the FIG. 6A case, the VCO must slow down to allow the jumps to align, while in the FIG. 6B case, the VCO must speed up to allow the jumps to align. Knowing whether the divider value NDIV is 99.9 or 100.1 with respect to the closest integer can resolve the ambiguity as to which case the slippage represents and therefore the appropriate polarity of the correction based on pulse 405. If NDIV is 99.5, equidistant from two integer values, observe that if one chooses N=99, then 99.5 looks high. If N=100, 99.5 appears low with respect to it. N is known, of course, so the appropriate polarity of the slippage correction is also known.

Thus, the DC correction operation has been described. The slip between the internal and charge pump ramps is eliminated. The remaining issue is that of canceling the ramp in the charge pump signal. We may assume at this point that we know the phase of the ramp signal exactly and its amplitude to within about 10%. We further assume that the generated internal ramp is symmetric about 0, so that adjustments in the amplitude do not result in DC shifts. A well known approach to eliminating known interference in electronic systems uses adaptive filtering techniques to correlate an output signal with the interfering signal.

In such an approach the correlator output drives a feedback gain on the interfering signal subtracted from the system input, which is intended to cancel the interfering signal in the output. Similarly, referring again to FIG. 5, in an embodiment the output 222 of the APD DSM 225 is multiplied by the ramp signal generator output in multiplier 509 and this result is applied to an integrator 511 whose output will adjust a gain on the ramp subtracted from the charge pump signal that is applied to the APD DSM input. By adjusting the integrator time constant, as is well known in practice (for example, in least mean squares (LMS) adaptive loops), a stable adaptive system may be produced. By finding an appropriate balance between stability of the adaptive loop and the noise generated by modulation of the feedback gain, one establishes the final design parameters.

While this approach to doing things is straightforward in light of modern adaptive filtering techniques, some additional issues remain. First, one may ask how effective the adapted system is in removing the strong spurs associated with the charge pump ramp waveform. Simulation shows that the spurs may be driven into the noise floor of the APD DSM output, even in the presence of competing input signals that would be significantly larger than those expected in a high performance PLL of the type envisioned here. The second question regards the computational burden imposed by the correlator, which requires, in principle, a precision multiplier of multibit digital signals. This question is obviated by the fact that the output of the APD DSM is substantially a one bit digital signal. Consequently, the multiplier is trivial, reducing the correlator 507 to essentially a digital integrator. Again, simulation confirms that such a correlator can reduce the spurs to within the noise floor. Hence, with relatively simple digital circuitry, one may completely adapt the front end circuitry to remove both DC and ramp errors, leaving a clean digital signal at the update rate which may be fed to the digital loop filter.

Another potential problem not yet addressed is due to the one bit signal from the APD DSM discussed above. Since this DSM is operated at the update rate, its quantization noise is almost always too large to be tolerated if the PLL jitter performance is important. A solution to this problem may be found by exploiting the anticipated behavior of the system under normal operating conditions. To begin, suppose that a certain conversion gain on the input jitter to APD DSM output is required for the desired PLL loop performance. Given a one bit output from the APD DSM, this imposes an overload value for the front end. In a typical case, this might be on the order of 200 ps. Overload occurs in a circuit block when the output of the block is no longer able to respond normally by virtue of reaching some limits, which is typically the result of an excessive input. In the case of the front end of a PLL, it is expected to produce an output proportional to the phase error at the input of the PLL. However, the output is limited in size by the power supply and other design factors. Since the gain of this block may need to be high, it is not unusual for the output to clip (i.e., reach its limits) with a relatively small input phase error. Thus, a relatively small phase error may cause overload. When the output of the front end is the output of a DSM producing a sequence of 0s and 1 s, it becomes clear that the limits of the output are 0—i.e., a sequence of all 0s, and 1—i.e., a sequence of all 1s. Clearly, some minimum and maximum phase error will produce all 0s or all 1s. This span of phase error at the input defines the overload range. On the other hand, the gain of the loop filter and intrinsic gain constant of the VCO determines how much frequency shift will result due to a change from all 0s to all 1s at the output of the DSM front end. Since a designer typically wants a fixed gain from the phase error at the input to the frequency shift at the VCO output (since this gain sets the loop bandwidth), more gain in the front end will be accompanied by less gain after it. Since the DSM makes noise due to its constant switching between discrete levels, corresponding to 0 and 1, the less gain after the DSM, the better. So, one wants more gain in the front end corresponding to a smaller overload range to minimize PLL noise. On the other hand, that means that the overload range can only cause a certain maximum frequency shift in the VCO. When a PLL starts up out of lock, it needs to jump to the right frequency to lock. This takes longer when the gain after the front end is smaller, corresponding to a higher front end gain, and consequently, a smaller overload range. Thus, a smaller overload range is good for noise and bad for initial phase lock. The overload value is important in ensuring initial lock. On the other hand, during normal operation where peak to peak jitter will be less than about 10 ps, the overload performance is irrelevant. In order to achieve adequate overload range during phase acquisition, the overload value should be large and, therefore, the one bit quantized output carries significant quantization noise.

Given operation at the update rate, the noise shaping of the DSM can only be of limited benefit in lowering the overall noise in band. Hence, the one bit output from the DSM is unacceptable in normal operation. Now suppose that one were to reduce the size of the one bit output from the DSM during normal operation. Then the quantization noise would be accordingly reduced. Given low jitter operation of the overall PLL, the limited swing at the output of the DSM may still be capable of reproducing the full signal dynamics despite the reduced dynamic range. If this output size reduction is done correctly, the overall conversion gain of the front end will be unaffected. It amounts to reducing the gain of an output stage in a feedback amplifier. If sufficient loop gain is maintained, the closed loop gain is substantially unaffected. This is the principle that may be applied in the present case. After initial phase lock the one bit quantization may be scaled down in post scale block 551 by a power of two trivially. It may be further reduced as the system settles into equilibrium behavior. Sufficient loop gain may be assured by increasing the gain of pre-scale block 549 in accordance with the gain reduction selected in post scale block 551. The result of this action is to reduce the net quantization noise of the APD DSM to a level where it allows sub-picosecond PLL jitter. Note that in some embodiments it may be possible to keep the quantization small always since the APD DSM is not utilized in mode one to achieve lock. However, when switching from mode one, the system is really not locked fully yet, so it can be valuable to help the system settle down more quickly to be able to scale after full lock in the second mode. Since this reduction can be readily accomplished digitally on the digital output of the DSM, very little overhead is introduced.

Referring again to FIG. 5, the block diagram shows additional details of the APD DSM and DC and ramp correction of the PLL front end as described above. Note the charge injected from the input charge pump is $T1 \times I_{CP}$, where T1 is defined in FIG. 3. An estimate 521 of average DC current is directly subtracted from this. The adapted DC signal 523 and ramp correction signal 525 are also subtracted. Finally, the feedback signal 527, with scale factor $_{GFB}$, from the output of the DSM is subtracted. Note that the DC correction signal is obtained by integrating either the dsm_out signal during mode one, where the control signal SW1 is asserted, or the ramp phase detector output during mode two, where the control signal SW1 is not asserted. The ramp correction signal is created by scaling the internally generated ramp by a combination of an estimate value 531 and the correlator output 533, where the correlator 507 comprises the multiplier 509 and the integrator 511. The estimate value 531 may be determined as follows. It is known that the ramp is 1 UI peak to peak. It is also known what the charge pump puts out as a function of this phase change, so the peak to peak charge pump output is known. The ramp correction signal is the output of a D/A converter, so one can scale its output to cancel the expected charge pump output. Since everything is subject to process and temperature variation, things are only "known" with a certain precision. Thus, the D/A gain is set according to the expected charge pump output and this becomes the "estimated value." Since the output of the DSM, dsm_out, is binary, the multiplier is easy to implement. The DSM 515 has a single analog integrator 542, which in practice could be a capacitor, followed by a quantizer 547. Before and after the quantizer are pre- and post-gain blocks 549 and 551. These gains are adjusted during two phases of mode two operation, immediately after switching from phase one and then after settling down into greater equilibrium. The post-gain block 551 reduces the output digital signal swing value and the pre-gain block 549 scales the loop gain so that it remains somewhat constant as the post-gain block 551 is reduced. This action allows the DSM overload to be relatively large initially and to be small when system equilibrium is reached, while substantially maintaining the bandwidth of the DSM.

Figure 7:
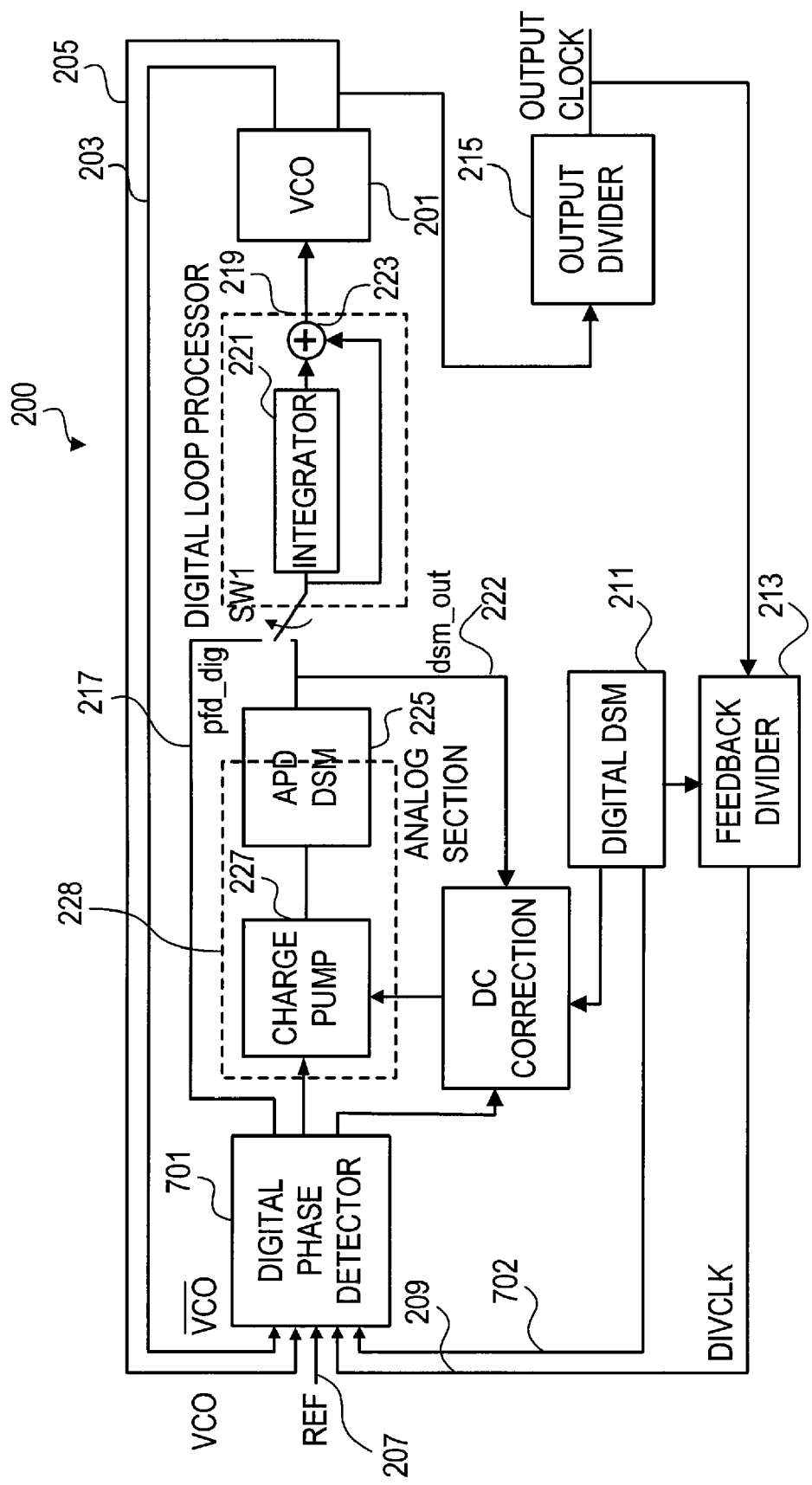
FIG. 7 illustrates a block diagram of another embodiment of a fractional-N PLL operable without a feedback divider (except for initial locking).

While the embodiment described above uses the ramp cancellation approach and the second phase detector, another embodiment uses a delta sigma modulator (DSM) to shape the noise. A block diagram of such an embodiment is shown in FIG. 7. While sliding clocks are still present in this embodiment, a delta sigma modulator (DSM) supplies a control signal on 702 to select one of several VCO clock edges following the REF clock edge, i.e., either the first edge, the second edge, the third edge, etc., with respect to the reference clock to gate the charge pump. Thus, for example, while the second clock edge may be the nominal edge on which to drive the charge pump, e.g., from the rising edge of the reference clock to the second rising edge of the VCO clock, the DSM is used to select alternative VCO clock edges to use, e.g., sometimes on the first VCO clock edge and sometimes on the third VCO clock edge. That is, the selected VCO clock edge varies according to the DSM output. Note that this approach may increase complexity in detecting clocks since additional VCO edges need to be detected. Further, the longer charge pump pulses generate bigger DC offsets and potentially some 1/f noise. Thus, DC offset correction is still required but the noise shifting approach using the DSM eliminates the need for the ramp cancellation.

Figure 8:
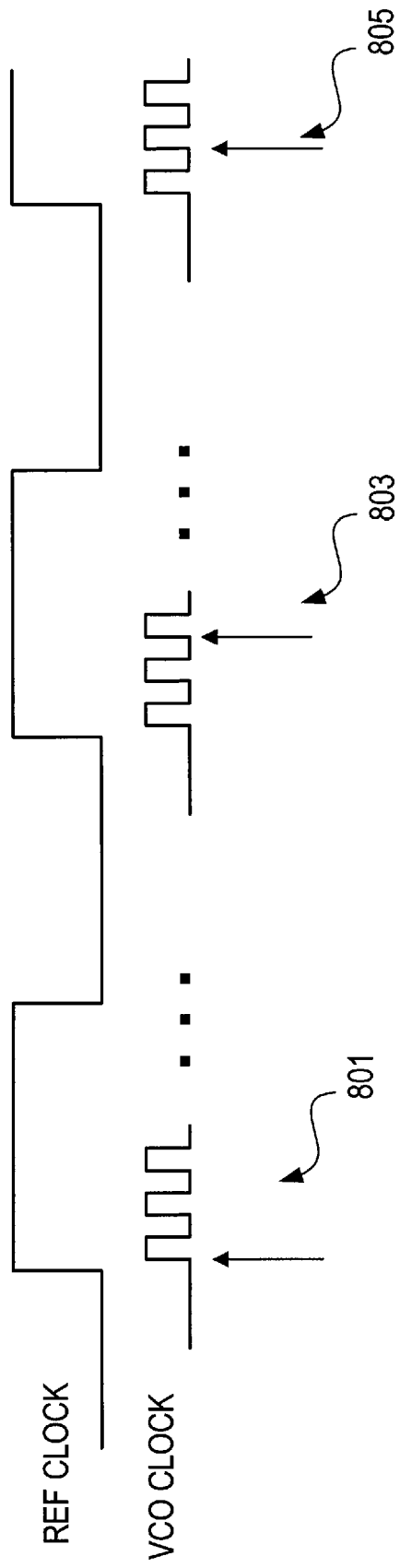
FIG. 8 is a timing diagram illustrating selection of VCO clock edges according to the embodiment of FIG. 7.

FIG. 8 is a timing diagram showing how the first edge after the rising edge of the reference clock (REFCLK) is selected at 801, the third edge at 802 and the second edge at 803.

Figure 9:
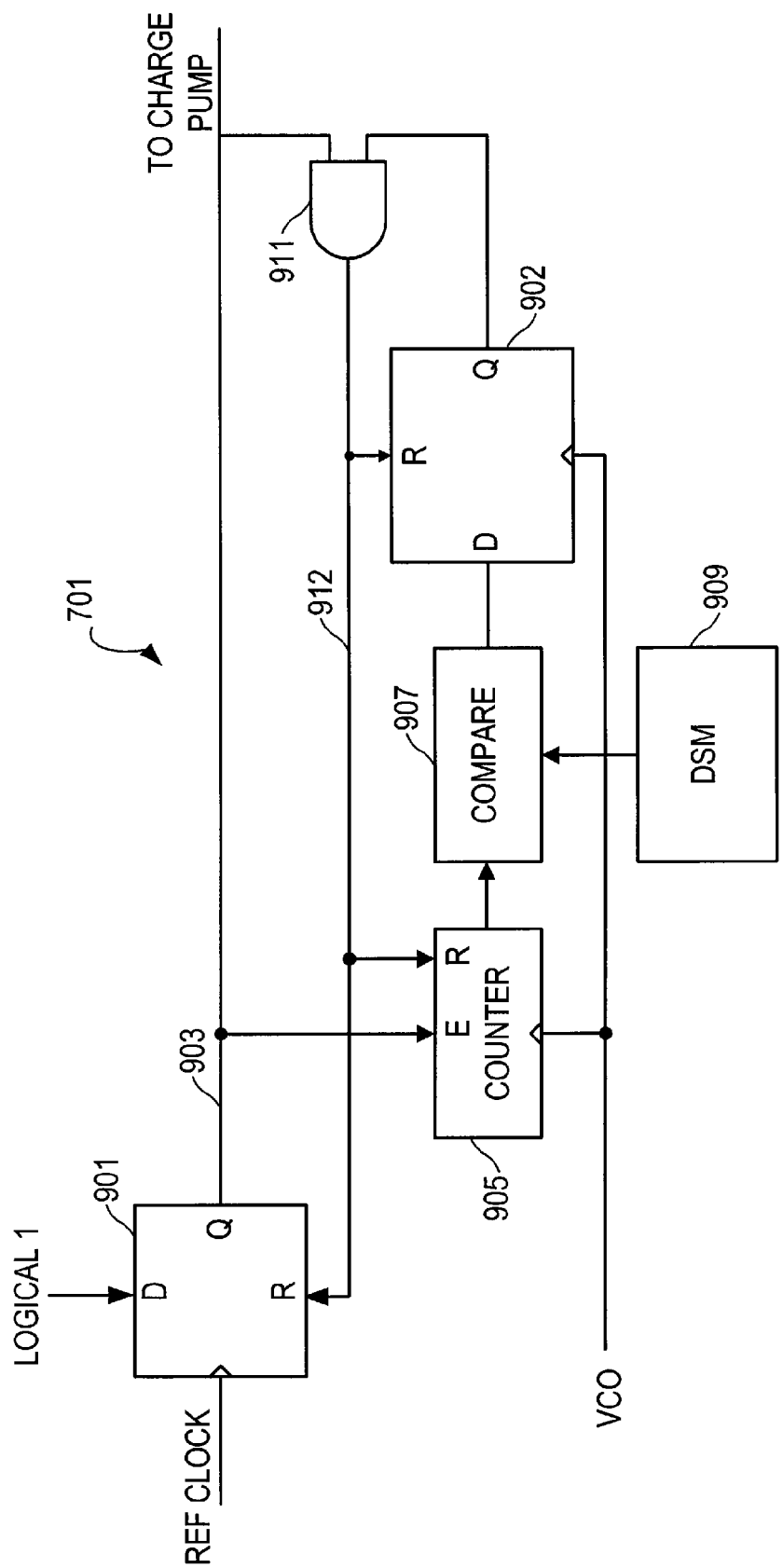
FIG. 9 illustrates additional details of the embodiment in FIG. 7 showing an exemplary implementation of a phase detector for the embodiment of FIG. 7.

Referring now to FIG. 9, illustrated is an exemplary implementation for aspects of phase detector 701 for the embodiment shown in FIG. 7. Flip flops 901 and 902 are responsive to clock signals from the VCO and the REFCLK input to the PLL. Assuming these flip flops are reset—i.e., Q=0, before the REFCLK rising edge, then when the REFCLK rising edge occurs, flip flop 901 has its Q output 903 set to 1. Output 903 is applied as an input to enable the counter 905. When the enable input (E) becomes 1, the counter will increment one count at a time upon each rising edge of its clock, which is the VCO clock. The output of the counter is compared to the number produced by the DSM block 909. When these numbers are equal, the output of the Compare block 907 becomes 1 which is applied as the D input to flip flop 902. Once the D input is set, the next rising edge of the clock, which is the VCO clock, to flip flop 902 will set its Q output to 1. Finally, when the Q output of 902 is set to 1, both inputs to AND gate 911 will be 1, resulting in a logic 1 output on line 912. This, in turn, will reset both flip flops and the counter so that the operation may be repeated upon the next rising edge of the REFCLK. Notice that the signal 903 at the output of flip flop 901 rises to a value of 1 from the time that the rising edge of REFCLK occurs until the Q output of flip flop 902 goes to 1. Thus, a pulse of duration equal to the time from the rising edge of the REFCLK to a selected rising edge of the VCO is obtained. This may be applied to a charge pump to produce the desired charge pump output. Further observe that if one wishes to terminate this pulse on the first rising edge of the VCO following the REFCLK, then the DSM output should be set to 0. If the second edge is desired to terminate the pulse, the DSM output should be 1, etc.

Figure 10:
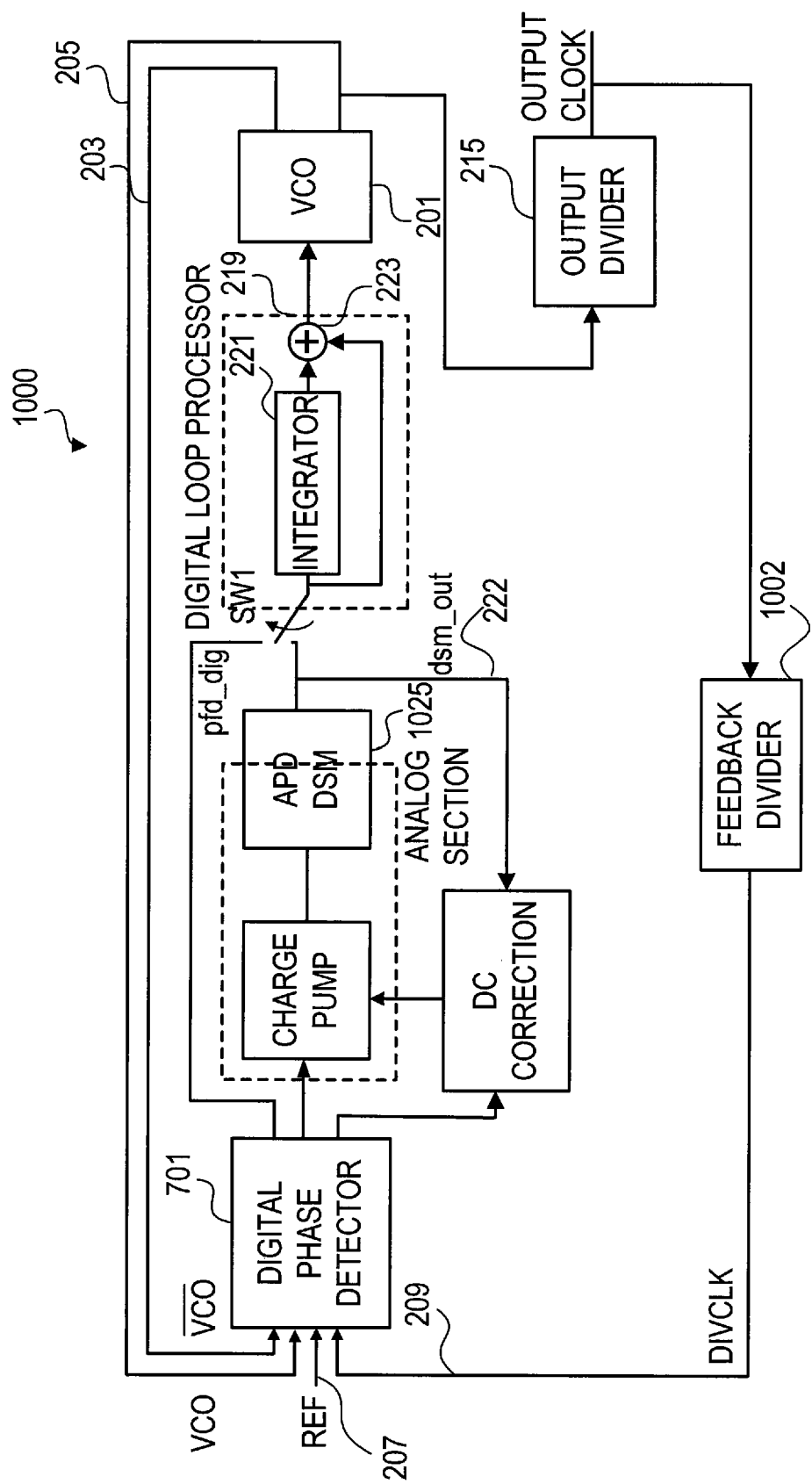
FIG. 10 illustrates a block diagram of an embodiment in which integer division is performed without a feedback divider.
Figure 11:
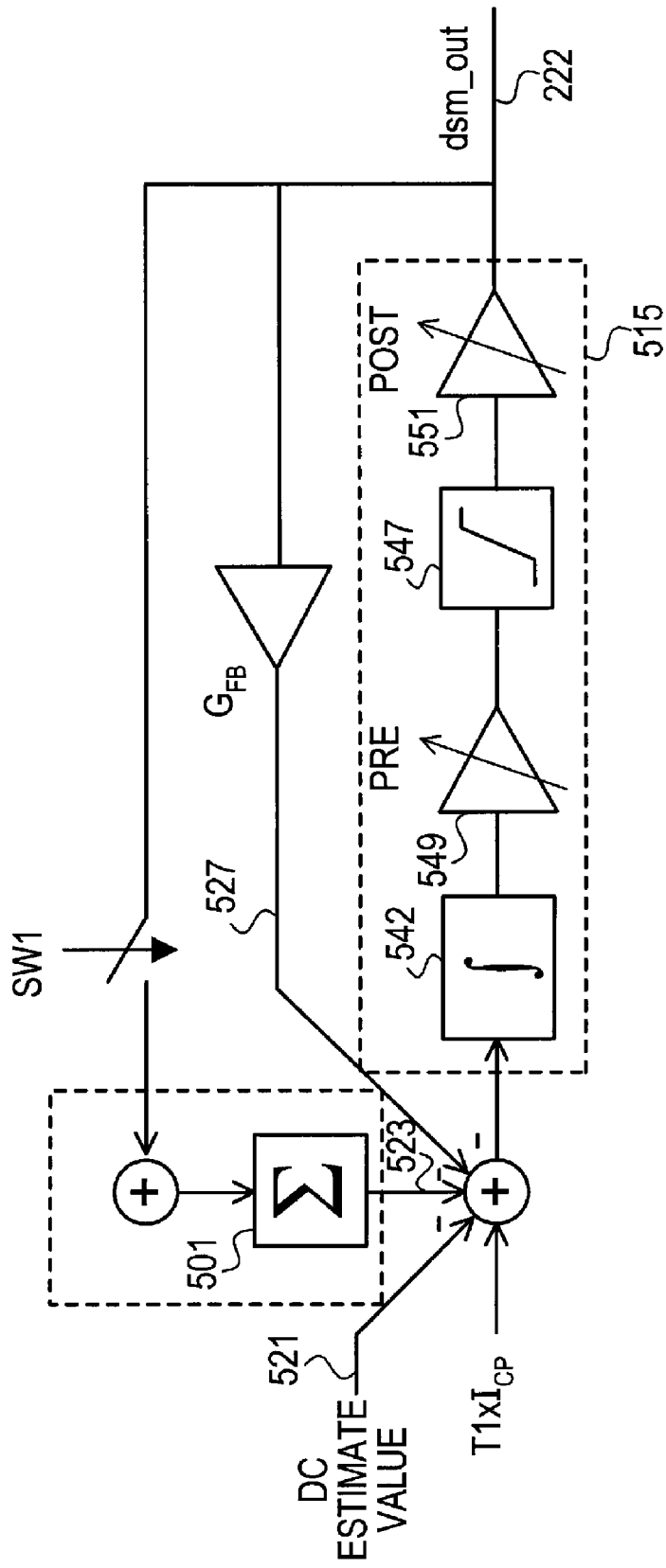
FIG. 11 illustrates additional details of the embodiment of FIG. 10.

Referring to FIG. 10 a block diagram of an integer divider 1000 is illustrated. Note that the absence of the fractional-N divider functionality simplifies the system. The block diagram operates in a first mode by locking the output of the VCO to the reference clock during which the feedback divider 1001 is in the loop and then entering a second mode in which the feedback divider is disconnected from the loop and a particular edge of the VCO clock is compared to a rising (or falling edge) of the reference clock. Because the divider is an integer divide operation, the relationship of the reference clock and the VCO clock is more stable making the ramp circuitry unnecessary in this embodiment. FIG. 11 is a block diagram illustrating additional details of the APD DSM 1017 and DC correction in an integer-N embodiment.

Thus, a PLL architecture has been described that can operate as a fractional-N or integer N PLL without the use of a feedback divider. While the embodiments described above utilize a feedback divider for initial lock, if the initial frequency could be guaranteed to be close enough, the embodiments of the PLL could operate without any feedback divider at all and operate in mode 2 all the time. The power savings available from use of the architecture described herein may be substantial. For example, some initial estimates of power savings are up 20-50% for a particular implementation as compared to standard fractional-N PLL architectures. Of course, any power savings available, if any, will vary widely based on such factors as system requirements, particular implementations, and process technologies.

The description of the invention set forth herein is illustrative and is not intended to limit the scope of the invention as set forth in the following claims. For example, while the description above has particularly paid attention to fractional-N PLLs, the invention is also applicable to PLLs with integer feedback dividers. Further, while the controllable oscillators described herein have generally been VCOs, other controllable oscillators, known to those of skill in the art can also be used. Variations and modifications of the embodiments disclosed herein may be made based on the foregoing description without departing from the scope and spirit of the invention as set forth in the following claims.

What is claimed is:

1. A method comprising:
generating a phase-locked loop (PLL) output signal that is a frequency multiple, greater than one, of a reference clock signal supplied to the PLL;
operating the PLL in a first mode in which an output of a feedback divider is compared with the reference clock signal to lock the PLL output signal to the reference clock signal; and
operating the PLL in a second mode after lock is achieved in the first mode to generate the PLL output signal without using the feedback divider while remaining locked to the reference signal.

2. The method as recited in claim 1 wherein the feedback divider is a fractional-N divider and the PLL output signal is a non-integer multiple of the reference clock signal.

3. The method as recited in claim 1 wherein the feedback divider is an integer divider and the PLL output signal is an integer multiple of the reference clock signal.

4. The method as recited in claim 1 further comprising reducing power supplied to the feedback divider during the second mode of operation.

5. The method as recited in claim 1 further comprising:
operating the PLL in a third mode after entering the second mode, in which the feedback divider is temporarily connected in the PLL to evaluate lock of the PLL; and
subsequently returning to the second mode.

6. The method as recited in claim 1 further comprising generating a phase error signal during the second mode in a first phase detector in the PLL according to a length of time between an edge of the reference clock signal and an edge of a controllable oscillator output signal after the edge of the reference clock signal.

7. The method as recited in claim 6 wherein the edge of the controllable oscillator output signal is a first edge that occurs after the edge of the reference clock signal plus a predetermined time delay greater than or equal to zero.

8. The method as recited in claim 6 further comprising selecting the edge of the controllable oscillator output signal from a plurality of edges of the controllable oscillator output signal occurring after the edge of the reference clock signal according to a signal supplied from a delta sigma modulator.

9. The method as recited in claim 6 further comprising:
supplying the phase error signal to a charge pump and generating a charge pump output signal corresponding to the phase error signal; and
generating a ramp signal digitally that corresponds to an expected difference between the controllable oscillator output signal and the reference clock signal due to a frequency difference between them.

10. The method as recited in claim 9 further comprising generating the ramp signal with a digital accumulator that accumulates a fractional portion of the expected difference.

11. The method as recited in claim 9 further comprising comparing the generated ramp signal to the charge pump output signal in a second phase detector and generating a second phase error signal indicative of the comparison and supplying the second phase error signal to adjust a DC offset correction value.

12. The method as recited in claim 9, further comprising substantially canceling a ramp signal present in the charge pump output signal caused by sliding of the reference clock and the controllable oscillator output signal with respect to each other.

13. The method as recited in claim 11 further comprising:
supplying an analog to digital converter with an input signal during the second mode that includes an arithmetic combination of the charge pump output signal, the DC offset correction value and one or more other signals, to achieve, in an output of the analog to digital converter, substantially zero DC offset; and
adjusting an output of the controllable oscillator according to the output of the analog to digital converter.

14. The method as recited in claim 13 further comprising generating an initial value for the DC offset correction value by integrating an output of the analog to digital converter.

15. The method as recited in claim 11 further comprising determining a polarity of a correction signal to adjust the DC offset correction value, the correction signal based on the second phase error signal, according to a divide value of the feedback divider used in the first mode of operation.

16. The method as recited in claim 13 further comprising correlating the output of the analog to digital converter with the generated ramp signal in a correlation circuit to create an adaptive control signal that automatically adjusts one of the one or more signals used to achieve ramp cancellation.

17. The method as recited in claim 13 further comprising scaling down the output of the analog to digital converter after initial lock to reduce quantization noise in the output of the analog to digital converter.

18. The method as recited in claim 17 further comprising operating at the reference clock frequency the first and second phase detectors, the analog to digital converter and a correlation circuit correlating the output of the analog to digital converter with the generated ramp to create an adaptive control signal that automatically adjusts one of the one or more signals used to achieve ramp cancellation.

19. The method as recited in claim 9 further comprising using the generated ramp function to cancel a portion of the charge pump signal corresponding to the expected difference between the VCO output signal and the reference clock signal.

20. The method as recited in claim 13 further comprising:
during the first mode, coupling a digital output of a third phase detector to the loop filter and leaving the analog to digital converter output disconnected from the loop filter; and
during the second mode supplying the loop filter with the output of the analog to digital converter instead of the digital output of the third phase detector.

21. A phase-locked loop (PLL) comprising a controllable oscillator, the phase-locked loop operable to compare an output signal of the controllable oscillator to a reference clock signal supplied to the phase-locked loop in a phase detector, adjust the controllable oscillator according to the comparison, and supply as the output signal of the controllable oscillator a frequency multiple greater than one of the reference clock signal; wherein the PLL is operable, after lock is achieved between the output signal and the reference clock signal, to generate the output signal without using a feedback divider while remaining locked to the reference clock signal.

22. The PLL as recited in claim 21 wherein the output signal is a non-integer multiple greater than one of the of the reference clock signal.

23. A phase-locked loop (PLL), operable in a first mode, to lock to a reference clock signal using a feedback divider in the PLL and operable in a second mode with the feedback divider disconnected from the PLL, to generate a PLL output signal that is a frequency multiple, greater than one, of the reference clock signal.

24. The phase-locked loop as recited in claim 23 wherein the PLL is operable to reduce power supplied to the feedback divider during the second mode.

25. The phase-locked loop as recited in claim 23 further comprising a controllable oscillator and a first phase detector coupled to receive an output of the controllable oscillator and the reference clock signal and configured to generate, in the second mode, a phase error signal according to a length of time between a transition of the reference clock signal and a particular transition of the output signal of the controllable oscillator with respect to the transition of the reference clock signal.

26. The phase-locked loop as recited in claim 25 wherein the particular transition is a first transition that occurs after the transition of the reference clock signal and a predetermined time delay greater than or equal to zero.

27. The phase-locked loop as recited in claim 25 wherein the particular transition of the VCO output signal used to determine the phase error is selected to be one of a plurality of transitions of the output signal occurring after the transition of the reference clock signal and the predetermined time delay, a particular one of the transitions selected according to a control signal.

28. The phase-locked loop as recited in claim 27 further comprising a delta sigma modulator to supply the control signal.

29. The phase-locked loop as recited in claim 25 further comprising:
a charge pump coupled to receive the phase error signal and generate a charge pump output signal corresponding to the phase error signal; and
a ramp circuit operable to generate a ramp signal corresponding to an expected difference between the controllable oscillator output signal and the reference clock signal due to a frequency difference between them.

30. The phase-locked loop as recited in claim 29 wherein the ramp circuit comprises a digital accumulator that accumulates a fractional portion of the difference in generating the ramp signal.

31. The phase-locked loop as recited in claim 29 further comprising a second phase detector coupled to compare the generated ramp signal and the charge pump output signal and generate a second phase error signal used to determine an adjustment value to adjust a DC offset correction value.

32. The phase-locked loop as recited in claim 31 wherein a polarity of the adjustment value is determined according to a divide value of the feedback divider used in the first mode of operation.

33. The phase-locked loop as recited in claim 31 further comprising an analog to digital converter coupled to receive an output of a summing circuit, the summing circuit coupled to arithmetically combine at least the charge pump output signal, a DC offset signal and a ramp cancellation signal, to achieve substantially zero DC offset and to substantially cancel a ramp signal appearing at an output of the analog to digital converter, the ramp signal caused by the sliding of the reference clock and the controllable oscillator clock with respect to each other.

34. The phase-locked loop as recited in claim 33 further comprising a correlation circuit to correlate the output of the analog to digital converter with the generated ramp signal to create an adaptive control signal that automatically adjusts the ramp cancellation signal used to achieve ramp cancellation.

35. The phase-locked loop as recited in claim 33 further comprising a scaling circuit operable to scale down the output of the analog to digital converter after initial lock to reduce quantization noise in the output of the analog to digital converter.

36. The phase-locked loop as recited in claim 33 wherein the first and second phase detectors, the analog to digital converter, and the ramp circuit are configured to operate at the reference clock frequency.

37. The phase-locked loop as recited in claim 33 wherein the generated ramp signal is coupled to cancel a portion of the charge pump signal corresponding to an expected difference between the controllable oscillator output signal and the reference clock signal.

38. The phase-locked loop as recited in claim 25 further comprising: a loop filter coupled in the first mode to a digital output of the first phase detector and
wherein the output of the analog to digital converter is disconnected from the loop filter in the first mode; and
wherein in the second mode the output of the analog to digital converter is coupled to the loop filter in place of the digital output of the first phase detector.

* * * * *

UNITED STATES PATENT AND TRADEMARK OFFICE
CERTIFICATE OF CORRECTION

| | |
|---|---|
| PATENT NO. | : 7,548,123 B2 |
| APPLICATION NO. | : 11/777779 |
| DATED | : June 16, 2009 |
| INVENTOR(S) | : Douglas R. Frey |

It is certified that error appears in the above-identified patent and that said Letters Patent is hereby corrected as shown below:

Col. 14, Line 64, (Claim 22), please replace "one of the of the" with --one of the--

Signed and Sealed this

First Day of September, 2009

David J. Kappos
*Director of the United States Patent and Trademark Office*